United States Patent [19]

Luce et al.

[11] Patent Number: 4,898,647

[45] Date of Patent: Feb. 6, 1990

[54] PROCESS AND APPARATUS FOR ELECTROPLATING COPPER FOIL

[75] Inventors: Betty M. Luce; Betty L. Berdan, both of Willowick, Ohio

[73] Assignee: Gould, Inc., Eastlake, Ohio

[21] Appl. No.: 288,472

[22] Filed: Dec. 22, 1988

Related U.S. Application Data

[63] Continuation-in-part of Ser. No. 813,097, Dec. 24, 1985.

[51] Int. Cl.$^4$ .............................................. C25O 1/04
[52] U.S. Cl. ..................................... 204/13; 204/216; 204/231
[58] Field of Search .......................... 204/13, 216, 231

[56] References Cited

U.S. PATENT DOCUMENTS 4,549,941 10/1985 Parthasarathi ........................ 204/27

Primary Examiner—T. M. Tufariello
Attorney, Agent, or Firm—Fay, Sharpe, Beall, Fagan, Minnich & McKee

[57] ABSTRACT

The present invention involves a process and associated apparatus for producing surface treated metal foil, comprising:

providing an electrolytic cell having an electrolyte and a cathodic surface immersed in the electrolyte, the electrolyte containing a concentration of matel ions;

applying a first current density in a frist zone for plating a relatively smooth metal foil deposit on the cathodic surface; and applying a pulsed second current density having a magnitude greater than the limiting current density in a subsequent second zone, the pulsed second current density forming a plurality of self adhering nodules on the base metal deposit.

31 Claims, 3 Drawing Sheets

PROCESS AND APPARATUS FOR ELECTROPLATING COPPER FOIL

REFERENCE TO EARLIER APPLICATION

This is a continuation in part of U.S. application Ser. No. 813,097, filed Dec. 24, 1885, pending.

BACKGROUND OF THE INVENTION

This present invention relates to the art of electroplating and more particularly to a method for producing electrodeposits of copper particularly useful for manufacturing printed circuits.

This invention is applicable to the formation of both conventional electrodeposited copper foil, as well as so called "ultra-thin" electrodeposited foils of copper on an aluminum carrier. While the present invention will be primarily described in the context of conventional unsupported foils, it is not intended in any way to be limited to such foils, but rather to also include foils of copper on an aluminum or other carrier. These unsupported foils may have a thickness on the order of from about 12 to about 35 microns or more, while so called supported foils are usually on the order of from about 5 to 12.0 microns and are typically deposited on an aluminum sheet of 50 to 75 microns. For the purposes of this disclosure, the term support is intended to include any suitable substrate, while the term aluminum is intended to embrace the commercially pure metal as well as alloys of the metal which are predominantly aluminum.

The well known basic techniques for manufacturing printed circuit boards involves depositing copper on a revolving drum or on a temporary carrier such as sheet of aluminum; optionally applying a treatment coating to the exposed surface of the copper foil (such as taught for example in U.S. Pat. No. 3,585,010); applying the exposed or treated surface of the copper to a printed circuit board, such as an epoxy resin impregnated fiberglass mat or substrate; bonding the copper surface to the epoxy resin through the use of heat and pressure, and then removing the temporary carrier if any.

In order for this laminate of copper foil on the resinous substrate to yield a quality printed circuit board, among other properties the foil must be highly pore-free and securely bondable to the substrate, this is particularly critical with thin foils. One way to improve the bond between the copper foil and the substrate is to produce a nodularized exposed surface on the copper foil, such as by producing a dentritic outer surface.

It should be noted that in the industry the term dendrite and/or dendritic deposit etc. have both a broad and a specific meaning. The specific meaning relates to deposits having thin needle like and/or tree like structures which tend to be very fragile and require an overlay of basic copper to assure good adhesion. The broad meaning of these terms relates to laying down of a roughened surface generally, including the production of a nodular or bumpy surface which adheres well without need for an overlay.

In the prior art, as first disclosed in U.S. Pat. No. 3,293,109 and later adapted in U.S. Pat. No. 3,990,926, a two or more step electrodeposition of copper had been necessary in order to produce a foil highly pore-free and securely bondable to the resinous substrate. Typically, this involves a first copper electroplate to build up a thickness of up to about 50 microinches to ensure a uniform copper substrate base and then at least one more bath and/or a different current density to provide the greater thickness buildup as needed and to nodularize the outer copper surface for increasing the bond strength between the foil and the substrate to which is it bonded or laminated.

Thus, a multi-step process of electroplating copper has heretofore been needed to yield a highly pore-free foil which is securely bondable to the resinous substrate or, in other terms has a high "peel strength". "Peel strength" is a conventionally used term to refer to the strength of the bond between the foil and the resinous substrate. Peel strength in excess of about 7 lbs./in., according to the standardized measuring method ASTM D/1867 is generally deemed necessary to satisfy printed circuit requirements.

The multi-step process although capable of producing pore-free foil with a nodularized outer surface does have the drawback of requiring close control and regulation between the steps. Not only does each step need careful monitoring but also process variables of each step such as bath composition, current density in the bath, temperature, etc. must be carefully coordinated with those of each other step. For example, if a two-step process is used in which the bath composition is changed in the second step, close coordination is needed between bath composition and other variables in the first step with the new bath composition of the second step. These control and coordination requirements do not yield a simple process. Even with careful control of this multi-step process, its complexity often gives rise to reliability problems. Additionally, the multiplicity of steps would give rise to the need for more space and equipment and corresponding expense associated with them.

U.S. Pat. No. 3,857,681 to Yates taught the application of a continuous high current density from an auxillary anode positioned beyond the end of the primary anode at exit end of the bath, i.e. posterior to the primary anode in the process, to provide a nodular or dendritic deposit. In practice, however, the Yates techniques provided a powdery deposit having very poor adhesion to the base copper deposit. In later U.S. Pat. No. 4,490,218, Kadija et al. teach the use of a plurality of high current density auxillary anodes embedded in the primary anode. While the current to the auxillary anodes may be pulsed, the surrounding lower current density is continuous. According to Kadija, their high current density anodes produce dendritic structures while the primary anode provides an overlay of base copper to bond the dendrites to the underlying base copper deposit.

Accordingly, it is an object of the present invention to provide an improved process of electroplating foil.

Another object of the present invention is to provide a one-step copper electroplating process which yields a uniform, virtually pore-free copper foil with a nodularized surface for strong adherence to an epoxy resin impregnated fiberglass circuit board.

Yet another object of the present invention is to provide a process which increases initial copper nucleation and provides a nodularized outer surface.

Yet another object of the present invention is to provide an improved process for electrodeposition of copper on a carrier.

Yet still another object of the present invention is to provide an improved process for electroplating pore-free copper on an aluminum carrier with a nodularized surface for strong adherence to an epoxy resin impregnated fiberglass circuit board.

Other objects and advantages of the present invention will become apparent from the following detailed description thereof, which includes the best mode contemplated for practicing the invention.

SUMMARY OF THE INVENTION

Figure 1:
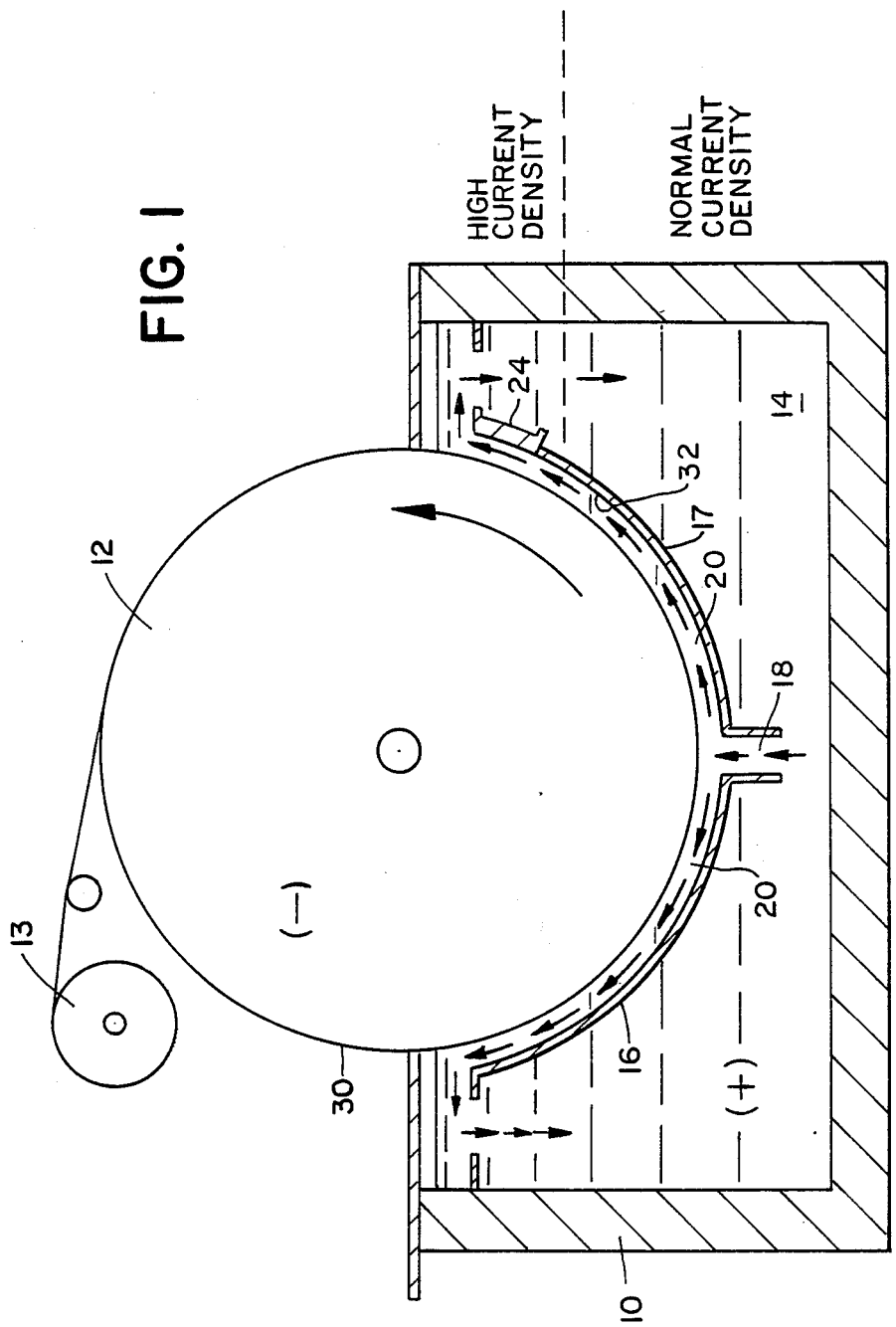
FIG. 1 is a schematic illustration, in partial cross-section, of one apparatus suitable for the practice of the present invention.

Broadly, the present invention concerns the providing of a process for electroplating copper in one single step which provides a highly pore-free ultra-thin foil with a nodularized outer surface.

In one aspect, the present invention involves a process particularly suitable for providing highly pore-free, foil with a nodularized surface for strong adhesion to a printed circuit board by electroplating copper, in a single step in an acidic copper bath in which at least two different current densities are employed. This process is typically performed employing a drum, or a carrier material such as aluminum as the cathode surface, and at least two anodes, at least one primary anode, and at least one treatment anode.

In another aspect, the present invention concerns a process for electroplating copper foil which increases initial copper nucleation for pore-free foil and provides a nodularized outer surface.

In yet another aspect the present invention involves a process for producing surface treated metal foil, said process comprising:

providing an electrolytic cell having an electrolyte and a cathodic surface immersed in said electrolyte, said electrolyte containing a concentration of metal ions;

applying a first current density in a first zone for plating a relatively smooth metal foil deposit on said cathodic surface; and applying a pulsed second current density having a magnitude greater than the limiting current density in a subsequent second zone, said second current density forming a plurality of nodules on said metal deposit.

In conventional, or unsupported foil applications of the present invention, the copper foil is electrodeposited on the surface of a rotating drum cathode in an acid copper bath, employing at least one primary anode, and in addition, at least one treatment or high current density anode which provides a high current density to produce a nodularized surface on the copper foil. The treatment effected by the high current density anode is preferably effected at or near the exit of the copper foil from the bath.

In electroplating ultra-thin foils, the carrier serves as the cathodic surface. Typically, an aluminum carrier is cleaned, etched in a caustic solution, rinsed and then pretreated with an alkaline, aqueous alkali metal zincate solution containing one or more water soluble salts selected from the group consisting of iron, cobalt and nickel salts. This coating is then substantially entirely removed by treating it with acid yielding a uniform thin oxide parting layer on the aluminum. This parting layer which is more fully explained in U.S. Pat. No. 3,969,199, assigned to the assignee of the present application, and incorporated herein by reference, provides an aluminum surface suitable for uniform high density copper nucleation during copper electrodeposition.

Since the metal atoms of copper are not deposited as a continous film but rather start at "favored sites" and spread laterally until a continuous film is formed, it is highly desirable to initially provide a large number of necleation centers. This is especially important in plating thin films in order to produce a highly pore-free foil. An ultra-thin copper foil is formed on the carrier after the single-step process which is pore free and has a nodularized surface for strong adhesion to a printed circuit board. Placement of one or more additional high current density treatment anodes at the entrance end of the bath can substantially improve the establishment of nucleation sites.

Referring to the figures, the apparatus illustrated in FIG. 1 comprises an electrolytic cell having a tank 10 formed from a suitable inert material such as lead or stainless steel. If desired, the tank 10 may be formed from an appropriate non-conducting material such as concrete and lined with a metal, such as lead or stainless steel, or a nonmetallic material such as polyvinvlchloride or rubber. A drum cathode 12 is mounted for rotation by suitable conventional mounting means not shown. The drum cathode may be formed from any suitable electrically conductive metal or metal alloy including lead, stainless steel, columbium, tantalum, titanium and alloys thereof. In a preferred construction, the drum cathode comprises a stainless steel drum having a polished plating surface formed from titanium, chromium, columbium, tantalum or an alloy thereof. The drum cathode 12 may be rotated by any suitable motor drive arrangement (not shown) known in the art.

The drum cathode 12 is mounted in the tank 10 so that it is at least partially immersed in an electrolyte solution 14. In a preferred arrangement, about half of the drum cathode extends beneath the surface of the electrolyte 14.

The electrolyte 14 generally comprises an acidic solution containing a concentration of ions of a metal to be electrodeposited. For example, where copper is to be electrodeposited, the electrolyte 14 contains a concentration of copper ions. In a preferred embodiment for forming nodularized copper foil or coral copper using the apparatus of the present invention, the electrolyte 14 comprises a copper sulfate-sulfuric acid solution. During operation, the solution while mixed at room temperature, is preferably maintained at a slightly elevated temperature. When maintained substantially at room temperature, the solution has a concentration of copper, preferably in the form of copper sulfate of about 10 grams/liter, hereinafter g/l, to about 60 g/l, preferably from about 15 g/l to about 40 g/l. The sulfuric acid can be present in the electrolyte 14 in a concentration up to that which causes copper to precipitate out as copper sulfate. In a preferred embodiment, the concentration of sulfuric acid for an electrolyte substantially at room temperature is from about 10 g/l to about 100 g/l.

It should be recognized that the aforementioned copper sulfate and sulfuric acid concentrations are dependent upon the electrolyte temperature. In the preferred embodiment the tank 10 is provided with means not shown for maintaining the electrolyte temperature at a desired level. The temperature maintaining means may comprise any suitable means known in the art such as a heating and/or cooling loop. At elevated temperatures, the copper sulfate concentration range may be increased beyond the aforementioned concentration range because its solubility limit increases with temperature. If desired, a proteinaceous material such as gelatin and/or a suitable surfactant may be added as is known in the art to the copper sulfate-sulfuric acid electrolyte to further facilitate the surface treatment process.

At least one arcuate insoluble primary anode is mounted in the tank 10 in close proximity to the rotating drum cathode 12. The purpose of the primary anode or anodes is to plate onto the drum surface 30 a relatively smooth deposit of metal from the electrolyte 14. While any number of primary anodes may be used, it is preferred as shown in FIG. 1 to use two arcuate anodes 16 and 17. It is also preferred to arrange the primary anodes 16 and 17 substantially concentric with the rotating drum cathode 12 and to space each anode from the drum surface 30 by a distance of about 4 mm. to about 25 mm. Most preferably, each anode is spaced from the drum surface 30 by a distance in the range of about 5 mm. to about 15 mm. The primary anodes 16 and 17 may be mounted in the tank 10 by any suitable conventional mounting device or devices not shown.

As well as being arranged in close proximity to the rotating drum cathode 12, the primary anodes 16 and 17 are preferably arranged with respect to each other so as to form an electrolyte passageway 18. During the foil fabrication process, the electrolyte is caused to flow through the passageway 18 and into the gaps 20 between the primary anodes 16 and 17 and the drum surface 30 by a pump not shown. Any suitable pump known in the art may be used to create this electrolyte flow. If desired, a manifold not shown may be mounted in the tank 10 adjacent the lower portion of the passageway 18 to assist in distributing electrolyte to the passageway 18.

The primary anodes 16 and 17 may be formed from any suitable electrically conductive material known in the art. For example, they can be formed from a variety of metals particularly lead or alloys thereof well known in the art. Anodes 16 and 17 may also be called "dimensionally stable anodes" or "DSA" such as those disclosed and claimed in U.S. Pat. Nos. 3,265,526 3,632,498 and /or 3,711,385. Both anodes 16 and 17 are electrically connected to a common power supply 22. Any suitable electrical connection can be made between the power supply 22 and anodes 16 and 17. The operation of the primary anodes 16 and 17 during the foil fabrication process is discussed below.

In accordance with a preferred embodiment of the present invention, a zone of high current density for applying a nodular layer to the electrodeposited foil is created by at least treatment anode 24 posterior to the end portion of the anode 17. Each treatment anode 24 should be electrically insulated from the anode 17 by an air gap or suitable dielectric material (not shown) which completely separates it from the anode 17. Where a dielectric material is used, any suitable dielectric material known in the art may be utilized.

To facilitate electrolyte agitation during all fabrication stages, each treatment anode 24 is joined to anode 17 in such a manner that a substantially smooth anode face 32, all portions of which are substantially equidistant from the drum surface 30, is formed. When a plurality of treatment anodes are employed at the exit or the entrance end of the bath, the spacing between each treatment anode is preferably from about 1 to about 3 times the gap between the anode surface and the drum surface. Most preferably, the spacing between treatment anodes is from about 1.0 to about 2.5 times the gap between the anode and the cathode surfaces 32 and 30, respectively.

Each treatment anode 24 is electrically connected to a power supply which is separate and distinct from the primary power supply. By employing different power supplies for the primary and treatment anodes, it is possible to simultaneously generate different current densities in the two application zones. The anode or anodes 24 may be connected to the separate power supply in any suitable fashion known in the art.

Any suitable power supply known in the art may be used for the power supplies. For example, each power supply could be a rectifier for applying a DC current or a variable power supply having means for generating a current having a regularly recurring pulse wave such as a sine wave, a square wave, a triangular wave or any other desired waveform. The only critical element is that the power supply to treatment anode 24, either by itself or in conjunction with a separate current interruption means, must supply a continuous series of pulses of current, the preferred duty cycle being an "on" cycle of at least 0.05 milliseconds and not more than about 50, and preferably less than 10 milliseconds, followed by an off cycle within the same general range, preferably from about $\frac{1}{3}$ to about 3 times the length of the "on" cycle.

During operation of the apparatus of the present invention, the electrolyte 14 is pumped into the passageway 18 and the gaps 20 between the primary anodes 16 and 17 and the rotating drum cathode 12 at a desired flow rate. A first current sufficient to generate a desired base current density is applied to the primary anodes 16 and 17 by the primary power supply. As previously discussed, the base current density should be below the limiting current density. As a result of the current applied to the primary anodes, metal from the electrolyte 14 is deposited onto the drum surface 30 in the primary plating zone. Since the base current density is preferably less than the limiting current density, a relatively smooth metal deposit having a substantially uniform thickness, e.g. a metal foil, forms on the drum surface 30.

As the electrodeposited metal foil enters the treatment zone or high density zone, a pulsed second current is applied to the treatment anode or anodes 24. The second current should be sufficient to generate in the treatment zone a second current density greater than the limiting current density.

For forming treated copper foil or coral copper using the copper sulfate-sulfuric acid electrolyte solution previously discussed, the electrolyte 14 should flow through the passageway 18 and the gaps 20 at a flow rate in the range of about 0.1 m/sec to about 4 m/sec, preferably from about 1 m/sec to about 2.5 m/sec. The base current density should be from about 0.2 A/cm$^2$ to about 2 A/cm$^2$, preferably from about 0.75 A/cm$^2$ to about 1.5 A/cm$^2$. In the treatment zone, the second pulsed current density should be an average current density from about 1.1 A/cm$^2$ to about 6 A/cm$^2$, preferably from about 2 A/cm$^2$ to about 3 A/cm$^2$.

Current density is in part a function of electrolyte flow, and as the electrolyte flow rate increases, a higher current density may be employed without charging the characteristics of the metal foil being deposited. In general, as used herein (unless otherwise clear from the context), the term "low current density" will be understood to mean a current density below the limiting current and generally in the range of from about 0.4A/cm$^2$ to about 2A/cm$^2$; and the term high current density shall be understood to mean a current density higher than the limiting amount and generally averaging in the range of from about 1.1A/cm$^2$ to about 6A/cm$^2$, it being understood that these ranges may be proportionally higher according to the cycle of the pulse current is employed.

After processing has been completed, the treated metal foil 28 may be removed from the drum cathode 12 in any suitable manner known in the art. For example, a knife blade not shown may be used to strip the treated foil from the drum cathode. Thereafter, the foil may be rinsed, dried, slit to size, rolled onto a take-up reel 13 and/or passed onto one or more treatment zones for one or more additional treatments, such as for example taught by U.S. Pat. No. 3,585,010 noted hereinbefore.

While the cell of FIG. 1 has been shown as having two primary anodes 16 and 17 forming a central fluid passageway 18, a single insoluble arcuate anode not shown may be used in lieu of the anodes 16 and 17. If a single anode is used, one or more openings should be provided in the central portion of the anode to permit electrolyte flow into the gap between the rotating drum surface and the anode surface. Of course, the treatment anode or anodes would be located as before forming the treatment zone.

While the invention has been described above in terms of a continuous treated foil production system, the treated metal foil may also be produced in a batchwise fashion if it is so desired. In such a batchwise system, a pulsed current applied to a portion of at least one primary anode could be used in lieu of the treatment anode or anodes 24 to apply the nodularizing treatment to the foil. The pulsed current has a first portion during which a first current density in excess of the limiting current density is produced and a second cycle during which the current density is off. Prior to the application of the pulsed current, a metal foil is electrodeposited in a conventional manner on a moving cathodic surface immersed in an electrolyte. The pulsed current is then applied for a relatively short time period as compared to the time period needed to produce the metal foil to apply the dentritic treatment to the metal foil. The pulsed current must be of sufficient density and duty cycle (on time) to deposit nodules of copper. In general the density of the pulsed current is in the range of from about 2,000 to about 10.000 amps per square foot with a duty cycle of from about 10 to 90%, preferably from abut 40 to 60%.

Figure 2:
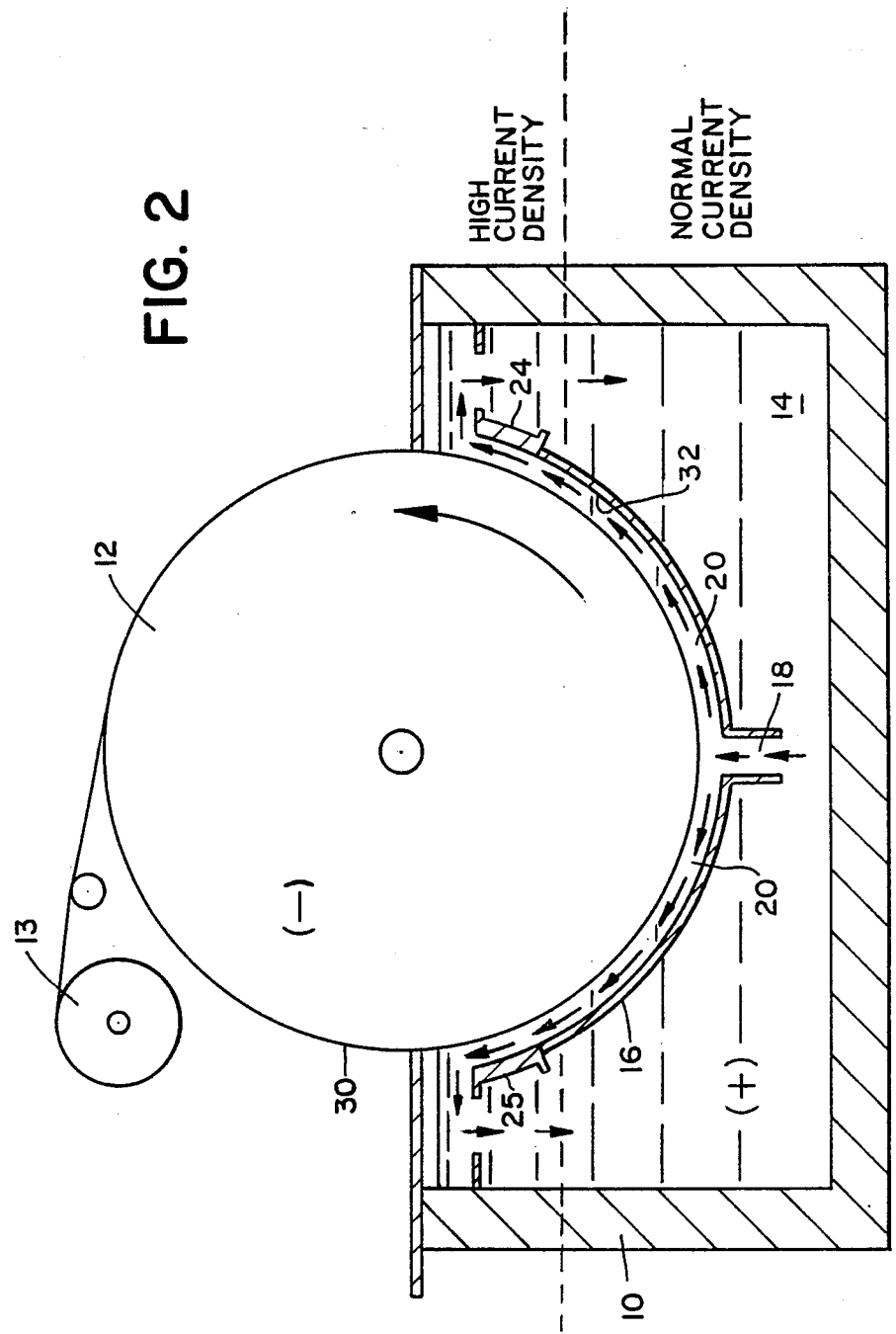
FIG. 2 is a schematic illustration, in partial cross-section, of another apparatus suitable for the practice of the present invention.

In the embodiment illustrated in FIG. 2, two high current density zones are employed, one at the exit end of the bath using anode 24, as in the embodiment of FIG. 1, and a second high current density zone at the entrance end of the bath using anode 25, which is constructed and insulated in a manner similar to that previously set forth hereinbefore with respect to anode 24.

The high current density zone at the entrance end provided using anode 25, provides the highly desirable nucleation centers noted hereinbefore which facilitate formation of pore-free foil. Anode 25 may operate at the same current density as anode 24, or using a third power supply means, at a higher or lower current density than anode 24. In addition, anode 25 may be connected to a switch means, not shown, whereby it can be optionally connected to the second or third power supply means to operate at a high current density, or to the primary power supply means in which case it operates at the lower current density and becomes, in effect, an extension of primary anode 16.

The following detailed discussion will serve by way of illustration and not by way of limitation to further describe the present invention and the improved results obtained thereby.

EXAMPLE

The apparatus of FIG. 1 was constructed using a laboratory "1/10"scale unit (i.e. approximately, 1/10 of the scale of a commercial unit) having a stainless steel cathode drum approximately 6 inches in diameter and about 5½ inches wide. A portion of the standard primary anode was removed and replaced by an auxillary anode as shown in FIG. 1 which was insulated from the remainder of the primary anode. The auxillary anode constituted approximately 8% of the overall anode area. The bath contained 95 gm/l of copper sulfate, 95 gm/l of sulfuric acid, 3.5 ppm of chloride and 3 mg/l of animal glue. The power was supplied by a conventional 1000 amp rectifier (0-18 volts) and the pulsing was generated by a NOVA-TRAM square wave pulse power supply Model DP-20-30-100. A series of experiments were conducted testing the use of the high current density anode at both the entrance end and the exit end by simply reversing the direction of the rotation of the drum. Use of the pulsed high current density at the entrance end resulted in a significant increase of the drum life and a reduction in the degree of porosity of the copper foil produced. A further series of experiments were conducted varying the current density duty cycle and pulsing cycle and it was consistantly found that using pulsed current, as opposed to continuous direct current, under otherwise similar conditions provided improved peel strength in every case, as set forth in Table 1.

TABLE 1

Effect of Current Density on Exit Anode (8% area)
Bulk CD 900 asf
50% Duty Cycle
2 milliseconds on - 2 milliseconds off
Medium frequency

| Current Density | Direct Current Peel Strength lbs./in. | Pulsed Current Peel Strength |
|---|---|---|
| 900 | 3.4 | 4.2 |
| 1800 | 4.0 | 5.0 |
| 2500 | 6.6 | 7.5 |
| 2900 | 8.0 | 8.5 |

In a still further series of tests, duty cycle and pulse time were varied. The results for this series of tests set forth in Table II.

TABLE II

Effect of Pulse Variables
Bulk CD 900 asf
Exit CD 2900 asf
Pulses - variable

| Sample | Duty Cycle | Milliseconds on Milliseconds off | Frequency | Peel Strength lbs./in. |
|---|---|---|---|---|
| 1 | 50 | 2-2 | Medium | 10.0 |
| 2 | 50 | 0.2-0.2 | High | 10.5 |
| 3 | 50 | 10-10 | Low | 12.5 |
| 4 | 71 | 0.5-0.2 | High | 10.0 |
| 5 | 71 | 5.0-2.0 | Low | 11.0 |

TABLE II-continued

Effect of Pulse Variables
Bulk CD 900 asf
Exit CD 2900 asf
Pulses - variable

| Sample | Duty Cycle | Milliseconds on Milliseconds off | Frequency | Peel Strength lbs./in. |
|---|---|---|---|---|
| 6 | 37 | 3.0-5.0 | Low | 12.5 |
| 7 | 37 | 0.3-0.5 | High | 9.5 |

Figure 3:
FIG. 3 is a photomicrograph of copper foil produced in accordance with the teaching of the present invention.

A scanning electron micrograph of a cross section of sample 1 at 800X is illustrated by FIG. 3, which clearly shows that the foil of the present invention has a heavy nodular configuration rather than the delicate needle or tree like structure of a classic dendridic deposit such as would require an overlay of virgin copper.

While we are unwilling to limit ourselves to any one theory by which the unique results of the present invention can be explained, it is possible that the "off" portion of the pulsing cycle provides an opportunity for the copper ions in close proximity to the auxillary anode to be replenished. When current is applied through the anode, copper ions are, of course, driven from solution and deposited as metal on to the surface of the cathode and this depletes the concentration of copper ions available for deposit until they are replenished in response to the ongoing agitation of the plating bath. The depletion of copper ions is significantly increased as the current density increases, particularly over the limiting current density. It may be, that by employing the pulsing current, the copper ions are replenished during the off cycle more efficiently than during the continuous current density cycle of the Yates or Kadija teachings. This is thought to be true of the Kadija teaching since even if Kadija employs pulsed current to the high current density anodes, a continuous overlay of current density below the limiting current density is still continuously applied even during the off cycle of the high current density. Again, while we will not accept any one theory by which the results of our invention can be explained, this would appear to be one very likely possible explanation.

As noted earlier in conjunction with the discussion of U.S. Pat. Nos. 3,857,681 and 4,490,218, if the high current density is near optimum, dendrites are caused to grow from the deposit already on the cathodic surface but they require an overlay of base copper to be well adhered to the base foil. If the current density exceeds the optimum, the deposit will be more powdery than dendritic, and a still heavier deposit of smooth copper may be required to insure adhesion of the "powdery" dendrites. The process of the present invention on the other hand produces a self adhering nodular surface as clearly shown by FIG. 3a.

The treated metal foil produced by the present invention may be laminated to an appropriate substrate. As will be apparent, the particular substrate used in the laminate will vary depending upon the use of which the laminate is intended and the service conditions under which the laminate will be used. Particularly approprate substrates include polytetrafluorethylene-impreganted fiberglass, polyimides, fiberglass impregnated by certain fluorocarbon products including polymers of trifluorochloroethylene and certain copolymers, and the like. Where the foil is to be bonded to an epoxy substrate, it is highly desirable to provide a barrier coating on the copper foil as taught in our earlier U.S. Pat. No. 3,585,010. If needed, an adhesive may be used to bond the treated foil to the substrate. Any suitable conventional technique known in the art may be used to bond the treated foil to the substrate.

While the preferred embodiment of the invention has been described in connection with the production of copper foil, the technique of the present invention is equally applicable to the electrodeposition of other metals including but not limited to lead, tin, zin, iron, nickel, gold and silver. Of course, the type of electrolyte, the metal and acid concentrations in the electrolyte, the flow rate, and the current densities used will have to be altered in accordance with the metal being plated.

While the cathode for the plating apparatus has been described as being a rotating drum cathode, it is as earlier noted possible to perform the process of the present invention using an endless belt-type cathode, i.e., a carrier support.

While the treatment anodes have been illustrated as having a bar shape, they may also as noted be round shaped or they may have square, oval, elongated or any other suitable shape.

The patents, patent application and foreign patent publications set forth in the specification are intended to be incorporated by reference herein.

It is apparent that there has been provided in accordance with this invention a process and apparatus for producing surface treated metal foil which fully satisfies the objects, means and advantages set foth hereinbefore. While the invention has been described in combination with the specific embodiments thereof, it is evidence that many alternatives, modifications, and variations will be apparent to those skilled in the art in light of the foregoing description. Accordingly, it is intended to embrace all such alternatives, modifications and variations as fall within the spirit and scope of the appended claims.

In the Claims:

1. A process for producing surface treated metal foil, said process comprising:
    providing an electrolytic cell having an electrolyte and a cathodic surface immersed in said electrolyte, said electrolyte containing a concentration of metal ions;
    applying a first current density in a first zone for plating a relatively smooth metal foil deposit on said cathodic surface; and,
    applying a continuous series of pulses of a second current density having a magnitude greater than the limiting current density in a second zone, said second current density forming a plurality of nodules on said metal deposit.

2. The process of claim 1 further comprising:
    providing at least one insoluble primary anode in said cell; at least one treatment anode in said cell positioned posterior to said primary anode and applying said second current to each said treatment anode.

3. The process of claim 2 further comprising:
    agitating said electrolyte in said first and second zones.

4. The process of claim 2 wherein said second current density consists of pulses of current having a duty cycle of from about 0.05 to about 50 milliseconds followed by an off cycle of from about 0.05 to about 50 milliseconds.

5. The process of claim 2 wherein said second current density consists of pulses of current having an duty cycle of from about 0.10 to about 10 milliseconds followed by an off cycle of from about 0.10 to about 10 milliseconds.

6. The process of claim 3 further comprising:
providing at least two primary anodes in said cell;
spacing said primary anodes from said cathodic surface and from each other so as to form a space between each said primary anode and said cathodic surface and at least one fluid passageway; and,
said agitating step comprising flowing said electrolyte at a desired rate through said at least one fluid passageway and said space between each said primary anode and said cathodic surface.

7. The process of claim 4 further comprising:
providing at least two primary anodes in said cell;
spacing said primary anodes from said cathodic surface and from each other so as to form a space between each said primary anode and said cathodic surface and at least one fluid passageway; and,
said agitating step comprising flowing said electrolyte at a desired rate through said at least one fluid passageway and said space between each said primary anode and said cathodic surface.

8. The process of claim 5 further comprising:
providing at least two primary anodes in said cell;
spacing said primary anodes from said cathodic surface and from each other so as to form a space between each said primary anode and said cathodic surface and at least one fluid passageway; and,
said agitating step comprising flowing said electrolyte at a desired rate through said at least one fluid passageway and said space between each said primary anode and said cathodic surface.

9. The process of claim 2 further comprising:
said electrolyte comprising a copper sulfate-sulfuric acid solution;
said first current density applying step comprising applying a first current density in the range of about 0.4 A/cm$^2$ to about 2 A/cm$^2$; and
applying said second current density in the range of about 1.1 A/cm$^2$ to abut 6 A/cm$^2$.

10. The process of claim 9 further comprising:
said first current density being in the range of about 0.75 A/cm$^2$ to about 1.5 A/cm$^2$; and
said second current density being in the range of abut 2 A/cm$^2$ to about 3 A/cm$^2$.

11. An apparatus for producing surface treated metal foil, said apparatus comprising:
an electrolytic cell containing an electrolyte having a concentration of metal ions;
a cathodic surface at least partially immersed in said electrolyte;
first anode means for applying a first current density in a first zone for plating a relatively smooth metal deposit on said cathodic surface; and
second anode means for applying a continuous series of pulses of a second current density having a magnitude greater than the limiting current density over said first current density in a second zone, said second current density means forming a plurality of nodules on said metal deposit firmly adhering to said metal foil without the need for a still further metal deposit on said metal foil.

12. The apparatus of claim 11 further comprising:
said first current density applying means comprising at least one insoluble primary anode in said cell and means for applying a first current to each said primary anode; and said second anode means comprising at least one treatment anode positioned in said cell posterior to said first anode means and means for applying a continuous series of pulses of a second current to said at least one treatment anode.

13. The apparatus of claim 12 further comprising:
a plurality of treatment anodes.

14. The apparatus of claim 13 further comprising:
means for agitating said electrolyte in said first and second zones.

15. The apparatus of claim 14 further comprising:
at least two primary anodes in said cell, said primary anodes being spaced from said cathodic surface and from each other so as to form at least one fluid passageway; and
said agitating means comprising means for causing said electrolyte to flow at a desired rate through said passageway and said space between each said primary anode and said cathodic surface.

16. The apparatus of claim 13 further comprising means to provide each said treatment anode with a current density consisting of pulses of current having a duty cycle of from about 0.05 to about 50 milliseconds followed by an off cycle of from about 0.05 to about 50 milliseconds.

17. The apparatus of claim 14 further comprising means to provide each said treatment anode with a current density consisting of pulses of current having a duty cycle of from about 0.05 to about 50 milliseconds followed by an off cycle of from about 0.05 to about 50 milliseconds.

18. The apparatus of claim 15 further comprising means to provide each said treatment anode with a current density consisting of pulses of current having an duty cycle of from about 0.05 to about 50 milliseconds followed by an off cycle of from about 0.05 to about 50 milliseconds.

19. The apparatus of claim 13 further comprising means to provide each said treatment anode with a current density consisting of pulses of current having a duty cycle of from about 0.10 to about 10 milliseconds followed by an off cycle of from about 0.10 to about 10 milliseconds.

20. The apparatus of claim 14 further comprising means to provide each said treatment anode with a current density consisting of pulses of current having an duty cycle of from about 0.10 to about 10 milliseconds followed by an off cycle of from about 0.10 to about 10 milliseconds.

21. The apparatus of claim 15 further comprising means to provide each said treatment anode with a current density consisting of pulses of current having an duty cycle of from about 0.10 to about 10 milliseconds followed by an off cycle of from about 0.10 to about 10 milliseconds.

22. A process for producing surface treated metal foil, said process comprising:
providing an electrolytic cell having an electrolyte and a cathodic surface immersed in said electrolye, said electrolyte containing a concentration of metal ions;
applying a continuous series of pulses of a first high current density in a first zone for producing nucleation sites on said cathodic surface;
applying a low current density below the limiting current density in a second zone for plating a relatively smooth metal foil deposit on said cathodic surface; and, applying a continuous series of pulses of a second high current density having a magnitude greater than the limiting current density in a third zone, said second high current density forming a plurality of nodules on said metal depost.

23. The process of claim 22 further comprising:
providing at leat two primary anodes in said cell,
spacing said primary anodes from said cathodic surface and from each other so as to form a space between each said primary anode and said cathodic surface and at least one fluid passageway; and,
an agitating step comprising flowing said electrolyte at a desired rate through said at least one fluid passageway and said space between each said primary anode and said cathodic surface.

24. The process of claim 23 further comprising:
said flow rate being from about 0.1 m/sec. to about 4 m/sec.

25. The process of claim 22 further comprising:
said electrolyte comprising a copper sulfate-sulfuric acid solution,
said second current density applying step comprising applying a current density in the range of about 0.2 A/cm$^2$ to about 2 A/cm$^2$; and
said pulses comprising a current density in the range of about 0.5 A/cm$^2$ to about 6 A/cm$^2$.

26. An apparatus for producing surface treated metal foil, said apparatus comprising:
an electrolytic cell containing an electrolyte having a concentration of metal ions;
a cathodic surface at least partially immersed in said electrolyte;
means for applying a continuous series of pulses of a high current density in a first zone for creating nucleation sites on said cathode surfaces;
means for applying a second, low, current density in a second zone for plating a relatively smooth metal foil deposit on said cathodic surface; and,
means for applying a continuous series of pulses of a second high current density having a magnitude greater than the limiting current density in a third zone, said second high current density forming a plurality of nodules on said metal deposit.

27. The apparatus of claim 26 further comprising:
said first current density applying means comprising at leat on insoluble primary anode in said cell and means for applying a first current to each said primary anode; and,
second high current density means comprising at least one treatment anode posterior to said primary anode.

28. The apparatus of claim 26 further comprising:
a plurality of high current density treatment anodes.

29. The apparatus of claim 26 further comprising:
at least two primary anode in said cell, said primary anodes being spaced from said cathodic surface and from each other so as to form at leat on fluid passeageway; and
agitating means comprising means for causing said electrolyte to flow at a desired rate through said passageway and said space between each said primary anode and said cathodic surface.

30. The apparatus of claim 26 wherein said cathodic surface comprises a rotating drum.

31. The apparatus of claim 26 wherein said cathodic surface comprises an aluminum carrier.

* * * * *